United States Patent
Tan (10) Patent No.: US 9,012,290 B2
(45) Date of Patent: Apr. 21, 2015

(54) STRUCTURE AND METHODS OF IMPROVING RELIABILITY OF NON-VOLATILE MEMORY DEVICES

(71) Applicant: GLOBALFOUNDRIES Singapore Pte Ltd, Singapore (SG)

(72) Inventor: Shyue Seng Tan, Singapore (SG)

(73) Assignee: GLOBALFOUNDRIES Singapore Pte Ltd, Singapore (SG)

( * ) Notice: Subject to any disclaimer, the term of this patent is extended or adjusted under 35 U.S.C. 154(b) by 0 days.

(21) Appl. No.: 14/448,691

(22) Filed: Jul. 31, 2014

(65) Prior Publication Data

US 2014/0342542 A1    Nov. 20, 2014

Related U.S. Application Data

(62) Division of application No. 13/107,005, filed on May 13, 2011, now Pat. No. 8,866,212.

(51) Int. Cl.
| | |
|---|---|
| H01L 29/92 | (2006.01) |
| H01L 21/28 | (2006.01) |
| H01L 29/423 | (2006.01) |
| H01L 29/66 | (2006.01) |
| H01L 29/788 | (2006.01) |
| H01L 29/792 | (2006.01) |
| H01L 29/78 | (2006.01) |
| H01L 29/49 | (2006.01) |
| H01L 29/51 | (2006.01) |

(52) U.S. Cl.
CPC .... *H01L 29/42324* (2013.01); *H01L 21/28273* (2013.01); *H01L 21/28282* (2013.01); *H01L 29/4234* (2013.01); *H01L 29/66825* (2013.01); *H01L 29/66833* (2013.01); *H01L 29/7881* (2013.01); *H01L 29/792* (2013.01); *H01L 29/7833* (2013.01); *H01L 29/4916* (2013.01); *H01L 29/512* (2013.01); *H01L 29/518* (2013.01)

(58) Field of Classification Search
CPC ............... H01L 21/28273; H01L 21/28282; H01L 27/1154; H01L 29/66833
USPC ............ 438/257–267, 288, E21.19, E29.309
See application file for complete search history.

(56) References Cited

U.S. PATENT DOCUMENTS

| | | | | |
|---|---|---|---|---|
| 7,635,633 | B2 * | 12/2009 | Oh et al. | 438/288 |
| 7,872,299 | B2 * | 1/2011 | Won | 257/326 |
| 8,546,870 | B2 * | 10/2013 | Kim et al. | 257/324 |
| 2006/0118859 | A1 | 6/2006 | Kim et al. | |
| 2009/0008701 | A1 | 1/2009 | Kim et al. | |
| 2010/0072535 | A1 | 3/2010 | Takashima et al. | |

* cited by examiner

*Primary Examiner* — Cuong Q Nguyen
(74) *Attorney, Agent, or Firm* — Amerson Law Firm, PLLC (57) ABSTRACT

A method includes forming a patterned gate stack for a memory device, the patterned gate stack including a gate insulation layer, a charge storage layer, a blocking insulation layer and a gate electrode, the gate insulation layer and the blocking insulation layer having an initial width. An etching process is performed on the patterned gate stack to selectively remove at least a portion of each of the gate insulation layer and the blocking insulation layer, the etching process reducing a width of each of the gate insulation layer and the blocking insulation layer from the initial width to a final width. After performing the etching process, at least one material layer is formed proximate sidewalls of the patterned gate stack, the at least one material layer laterally confining each of the gate insulation layer, the charge storage layer, the blocking insulation layer, and the gate electrode.

20 Claims, 10 Drawing Sheets

STRUCTURE AND METHODS OF IMPROVING RELIABILITY OF NON-VOLATILE MEMORY DEVICES

CROSS-REFERENCE TO RELATED APPLICATION

This is a divisional of co-pending application Ser. No. 13/107,005, filed May 13, 2011.

BACKGROUND OF THE INVENTION

1. Field of the Invention

Generally, the present disclosure generally relates to the manufacturing of sophisticated semiconductor devices, and, more specifically, to structures and methods for improving the reliability of non-volatile memory devices.

2. Description of the Related Art

Figure 1A:
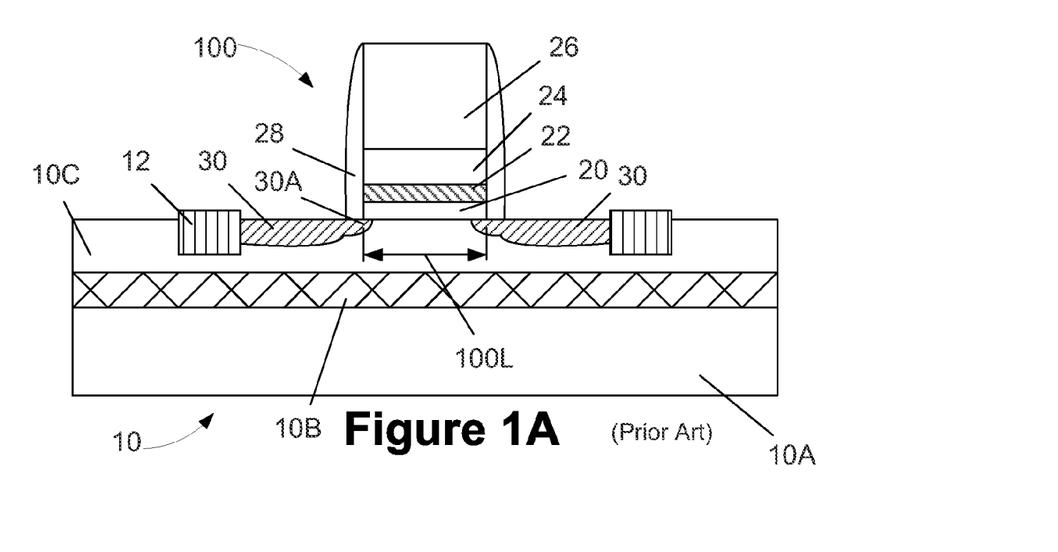
FIGS. 1A-1B schematically depict an illustrative prior art memory device and associated locations of the peak electrical field for such a device.

Non-volatile memory devices are in widespread use in many modern integrated circuit devices and in many consumer products. In general, memory devices are the means by which electrical information is stored. FIG. 1 depicts one illustrative example of a prior art memory device 100. In general, the memory device 100 includes a gate insulation layer 20 (sometimes referred to as a "tunnel oxide"), a charge storage layer 22, a blocking insulation layer 24, a gate electrode 26, spacers 28, and illustrative source/drain regions 30. The illustrative memory device 100 is formed in and above the active layer 10C of the semiconducting substrate 10. An illustrative isolation structure 12, e.g., a shallow trench isolation structure, that is formed in the substrate 10 to electrically isolate the memory device 100 from other adjacent devices is also depicted. In one illustrative embodiment, the semiconducting substrate 10 a silicon-on-insulator (SOI) substrate comprised of bulk silicon 10A, a buried insulation layer 10B (commonly referred to as a "BOX" layer) and an active layer 10C, which may also be a silicon material. The various structures depicted in FIG. 1 may be made from a variety of material. In one typical configuration that is commonly employed the gate insulation layer 20 and the blocking insulation layer 24 are made of silicon dioxide, the charge storage layer 22 is made of silicon nitride, and the gate electrode 26 is made of polysilicon. This is sometimes referred to as an "ONO" type memory device because of the materials employed (Oxide-Nitride-Oxide). In another common configuration the gate insulation layer 20 and the blocking insulation layer 24 are made of silicon dioxide, while the charge storage layer 22 and the gate electrode 26 is made of polysilicon. This is sometimes referred to as a "floating gate" type memory device.

Millions of such memory devices 100 are typically included in even very basic electronic consumer products. Irrespective of the type of memory device, there is a constant drive in the industry to increase the performance and durability of such memory devices. In typical operations, an electrical charge is stored on the charge storage layer 22 to represent a digital "1" while the absence of such an electrical charge on the charge storage layer 22 indicates a digital "0". Special read/write circuitry is used to access the memory device to store information on such a memory device and to determine whether or not a charge is present on the charge storage layer 22 of the memory device. These program/erase cycles ("P/E cycles") typically occur millions of times for a single memory device 100 over its effective lifetime.

Unfortunately, a large number of P/E cycles can cause damage to the device 100, such as damage to the gate insulation layer 20, and limit the useful life of the device 100. For example, over time, such P/E cycles can cause the access time of the memory device to increase thereby making the memory device slower to use. As a result the system or device that includes the memory device may operate at a slower overall speed. Another problem with such memory devices is a result of process induced defects. The manufacture of the memory device involves many complex manufacturing steps that include oxidation processes, heating processes, etching processes, deposition process, etc., that are performed in a detailed sequence in order to make the device. Some of these process operations are performed at elevated temperatures and expose parts of the device to very harsh environments. One example of a process induced defect is the stress induced in one or more of the layers that make up the memory device 100 when the device is subjected to various etching process. Another example of a process induced defect is the damage to the gate insulation layer 20 that may occur during ion implantation processes, like so-called HALO implant processes. Both process induced defects and P/E cycle induce defects can cause problems such as slowing the operation speed of the memory device 100 and reducing its ability to hold an electrical charge on the charge storage layer 22.

Figure 1B:
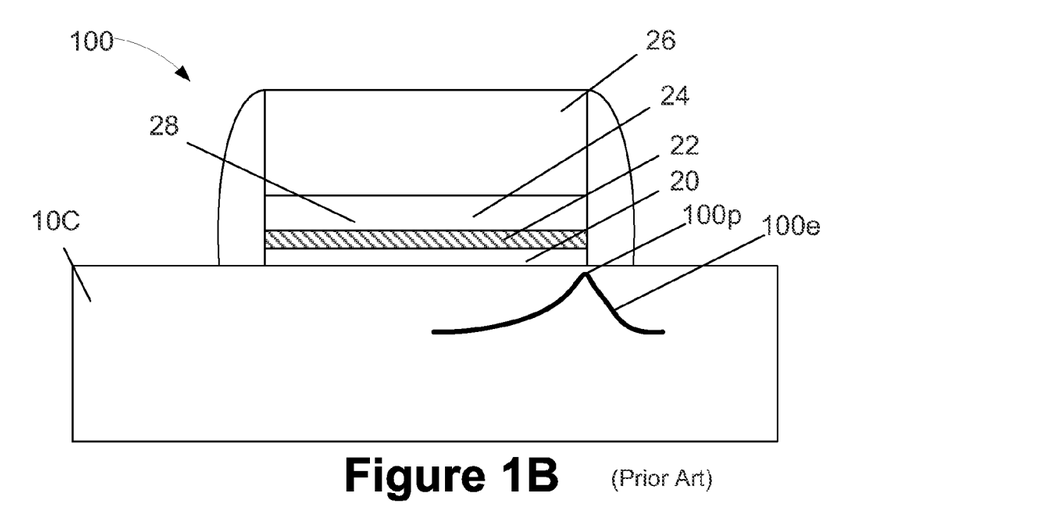

The channel length 100L of the memory device 100 has greatly decreased over the years. For example, in current-day memory devices, the channel length 100L may be on the order of 0.3-0.8 μm, and there is a constant drive to reduce this gate length even further. In general, the operation of the memory device 100 involves applying a voltage to the gate electrode 26 so as to set up an electrical field that established an inversion layer in the substrate under the gate insulation layer 20. Once this inversion layer is established, electrons may flow from the source region to the drain region. Unfortunately, this electrical field is not uniform across the device in the gate length direction (from left to right when viewing FIG. 1A). FIG. 1B is a cross sectional view of the device 100 wherein only the basic gate structure is depicted so as to discuss various aspects of this non-uniform electrical field that is established for the device 100 during operations. As shown in FIG. 1B, the highest magnitude or peak value 100p of the electrical field 100e is typically present near the outer edge of the gate insulation layer 20. Due to the presence of the peak value 100p of the electrical field 100e near the edge of the gate insulation layer 20, it is the outer edge(s) of the gate insulation layer 20 that are mostly likely to be damaged during repeated P/E cycles. Efforts have been made to lower the magnitude of peak value 100p of the electrical field 100e to address such problems but such a solution typically results in the device 100 that exhibits poor programming speeds. Various implantation techniques have been used to move or shift the location of the peak value 100p of the electrical field 100e away from the edge region of the gate insulation layer 20. For example, in some devices the distance between the extension regions 30A of the source/drain regions 30 has been decreased (by increasing dopant dosage) in an effort to shift the location of the peak value 100p of the electrical field 100e more toward the center of the gate insulation layer 20, but such a "solution" produces a device where it is very difficult to control the so-called short channel effects. In other devices, the distance between the extension regions 30A of the source/drain regions 30 has been increased (by decreasing dopant dosage) in an effort to shift the location of the peak value 100p of the electrical field 100e outwardly (in a direction toward the source/drain regions) and away from the gate insulation layer 20, but such a "solution" produces a device that exhibits poor programming speeds.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to the manufacturing of sophisticated semiconductor devices, and, more specifically, to structures and methods for improving the reliability of memory devices, such as non-volatile memory devices and the like. In one illustrative embodiment disclosed herein, a method includes forming a patterned gate stack for a memory device, the patterned gate stack including a gate insulation layer, a charge storage layer, a blocking insulation layer and a gate electrode, the gate insulation layer and the blocking insulation layer having an initial width. The illustrative method also includes, among other things; performing an etching process on the patterned gate stack to selectively remove at least a portion of each of the gate insulation layer and the blocking insulation layer, the etching process reducing a width of each of the gate insulation layer and the blocking insulation layer from the initial width to a final width. Furthermore, the disclosed method includes, after performing the etching process, forming at least one material layer proximate sidewalls of the patterned gate stack, the at least one material layer laterally confining each of the gate insulation layer, the charge storage layer, the blocking insulation layer, and the gate electrode.

Another exemplary method of the present disclosure includes forming a gate stack of a memory device, wherein the gate stack includes a gate insulation layer having first and second edges, a charge storage layer formed above the gate insulation layer and having first and second edges, a blocking insulation layer formed above the charge storage layer and having first and second edges, and a gate electrode formed above the blocking insulation layer and having first and second sidewalls. Furthermore, the first edge of the charge storage layer is laterally and inwardly offset from the first edge of the gate insulation layer, the first edge of said blocking insulation layer, and the first sidewall. The disclosed method also includes, among other things, forming a first spacer adjacent to the first sidewall and the respective first edges of the gate insulation layer, the charge storage layer, and the blocking insulation layer, wherein the gate insulation layer, the blocking insulation layer, and the first spacer at least partially define a first gap that is positioned laterally adjacent to at least the first edge of the charge storage layer. Additionally, a second spacer is formed adjacent to the second sidewall and the respective second edges of the gate insulation layer, the charge storage layer, and the blocking insulation layer, wherein the first and second spacers laterally confine each of the gate insulation layer, the charge storage layer, the blocking insulation layer, and the gate electrode.

In yet a further illustrative embodiment disclosed herein, a method for forming a memory device includes forming a gate insulation layer having a first width above a semiconducting substrate and forming a charge storage layer having a second width above the gate insulation layer, wherein the second width is less than the first width. The disclosed method further includes, among other things, forming a blocking insulation layer having the first width above the charge storage layer and forming a gate electrode having the first width above the blocking insulation layer. Finally, the illustrative method includes forming a sidewall spacer adjacent to and laterally confining each of the gate insulation layer, the charge storage layer, the blocking insulation layer, and the gate electrode, wherein the sidewall spacer, the gate insulation layer, and the blocking insulation layer at least partially define a first gap that is positioned laterally adjacent to at least a first edge of the charge storage layer.

BRIEF DESCRIPTION OF THE DRAWINGS

The disclosure may be understood by reference to the following description taken in conjunction with the accompanying drawings, in which like reference numerals identify like elements, and in which:

FIGS. 7A-7C depict yet another illustrative method of forming illustrative examples of a memory device described herein While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to structures and methods for improving the reliability of memory devices, such as non-volatile memory devices. As will be readily apparent to those skilled in the art upon a complete reading of the present application, the disclosed methods and devices are applicable to both stand-alone or dedicated memory devices as well as embedded memory devices. With reference to FIGS. 2-7, various illustrative embodiments of the novel methods and structures disclosed herein will now be described in more detail. Reference may also be made to FIG. 1, if required, wherein the use of the same reference number in the drawings will refer to the same structure as previously described.

Figure 2A:
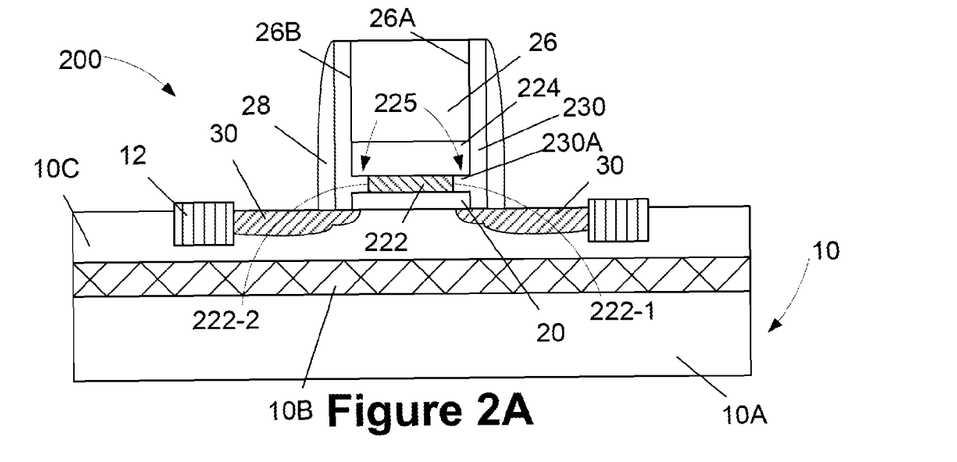
FIGS. 2A-2C depict illustrative examples of a novel memory device described herein.

FIG. 2A depicts one illustrative example of a novel memory device disclosed herein. In general, the memory device 200 includes a gate insulation layer 20, a charge storage layer 222, a blocking insulation layer 224, a gate electrode 26, a layer of insulating material 230, spacers 28, and illustrative source/drain regions 30. The illustrative memory device is formed in and above the active layer 10C of the semiconducting substrate 10. An illustrative isolation structure 12, e.g., a shallow trench isolation structure, that is formed in the substrate 10 is also depicted. In one illustrative embodiment, the semiconducting substrate 10 a silicon-on-insulator (SOI) substrate comprised of bulk silicon 10A, a buried insulation layer 10B (commonly referred to as a "BOX" layer 10B and an active layer 10C, which may also be a silicon material. Of course, the present invention is equally applicable to other configurations of the substrate 10. For example, the substrate 10 may be comprised of semiconducting materials other than silicon and/or it may be in another form, such as a bulk silicon configuration. Thus, the terms substrate or semiconductor substrate should be understood to cover all forms of semiconductor structures.

The gate insulation layer 20 (which is sometimes referred to in the industry as a "tunnel oxide") may be comprised of a variety of materials, such as silicon dioxide, a combination of materials such as silicon dioxide/silicon nitride/silicon dioxide, etc., and it may have a thickness ranging from 5-10 nm. The charge storage layer 222, may be comprised of a variety of materials, such as silicon nitride, a conductive material, polysilicon, amorphous silicon, a high-k dielectric (k value greater than 10), etc., and it may have a thickness ranging from 5-10 nm. To the extent the charge storage layer 222 is comprised of a high-k material, it may be comprised of materials such as the following: tantalum oxide ($Ta_2O_5$) with a k of approximately 25, strontium titanium oxide ($SrTiO_3$), having a k of approximately 150, hafnium oxide ($HfO_2$), HfSiO, zirconium oxide ($ZrO_2$) and the like. The blocking insulation layer 224, may be comprised of a variety of materials, such as silicon dioxide, a high-k insulating material such as those previously described, etc., and it may have a thickness ranging from 5-15 nm. The gate electrode 28, may be comprised of a variety of materials of conductive materials, such as polysilicon, amorphous silicon, silicon-germanium, germanium, etc., and it may have a thickness ranging from 80-150 nm. The layer of insulating material layer 230 may be comprised of a variety of materials, such as silicon dioxide, silicon nitride, etc., and it may have a thickness ranging from 5-10 nm.

In one particularly illustrative example of the memory device 200 the gate insulation layer 20 may be comprised of silicon dioxide, the charge storage layer 222 may be comprised of silicon nitride, the blocking insulation layer 224 may be comprised of silicon dioxide, and the gate electrode 26 may be comprised of polysilicon. In another particularly illustrative example of the memory device 200 the gate insulation layer 20 may be comprised of silicon dioxide, the charge storage layer 222 may be comprised of polysilicon (which is sometimes referred to in the industry as a "floating gate"), the blocking insulation layer 224 may be comprised of silicon dioxide, and the gate electrode 26 may be comprised of polysilicon. Additionally, it should be noted that the charge storage layer 222 and the gate electrode 26 may be made from the same or different materials, and similarly, the gate insulation layer 20 and the blocking insulation layer 224 may be made from the same or different insulating materials.

Figure 2B:
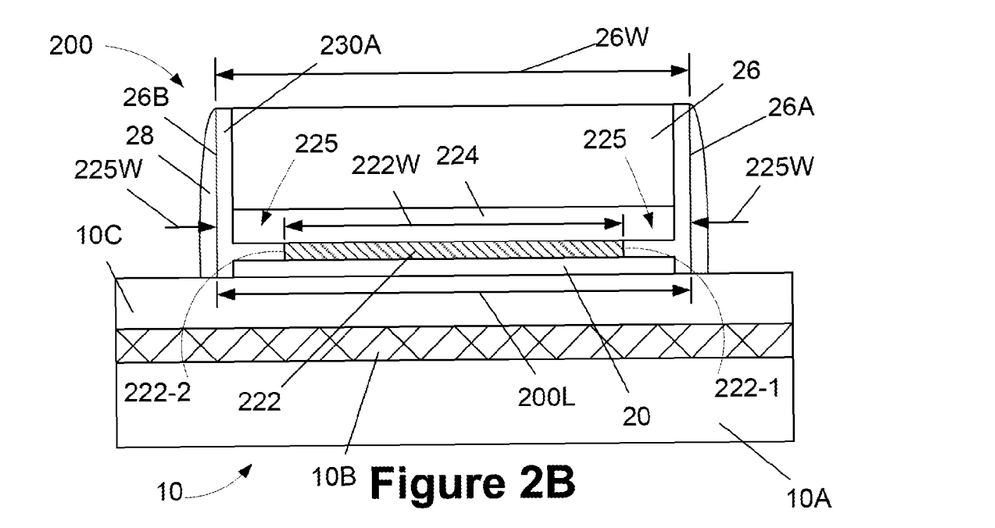

FIG. 2B is an enlarge view of the gate structure of the memory device 200. As can be seen therein, the charge storage layer 222 has a width 222W that is less than the width 26W of the gate electrode 26. In one illustrative embodiment, the width 222W may be approximately 70-90% of the width 26W of the gate electrode 26. The charge storage layer 222 has a first edge 222-1 and a second edge 222-2. The gate electrode 26 has a first sidewall 26A and a second sidewall 26B. In the illustrative example depicted in FIG. 2A, the first edge 222-1 is laterally and inwardly offset from the sidewall 26A of the gate electrode 26, and the second edge 222-2 is laterally and inwardly offset from the sidewall 26B of the gate electrode 26. In the particular example depicted in FIG. 2A, the edges 222-1 and 222-2 are laterally and inwardly offset from the edges 26A, 26B, respectively, by the same approximate amount such that the charge storage layer 222 is approximately symmetrically positioned above the gate insulation layer 20. The charge storage layer 222, with its offset edges, partially defines regions 225 between the edges of the charge storage layer 222 and the projections of the sidewalls 26A-26B of the gate electrode 26. In effect, these regions 225 are regions that would normally be occupied by portions of the charge storage layer in prior art memory device. In one illustrative example, these regions 225 have a width 225W that is approximately equal to 5-15% of the gate length 200L of the memory device 200, and in one specific example to approximately 10% of the gate length 200L of the memory device 200. In the illustrative example depicted in FIGS. 2A, an insulating material is formed or positioned in the regions 225. Of course, as will be appreciated by one skilled in the art, the various structures of the device 200 on an actual manufactured device, such as the charge storage layer 222, the gate electrode 26, the edges 222-1, 222-2, etc. may not have the precise squared- edge configurations as depicted in the drawings. To the extent such a structure does not have a precise configuration, e.g., the gate electrode 26 may have a generally, somewhat tapered configuration (wider at the bottom than at the top), any reference to any such structure's length or width should be the greatest length or width of such a structure.

Figure 2C:
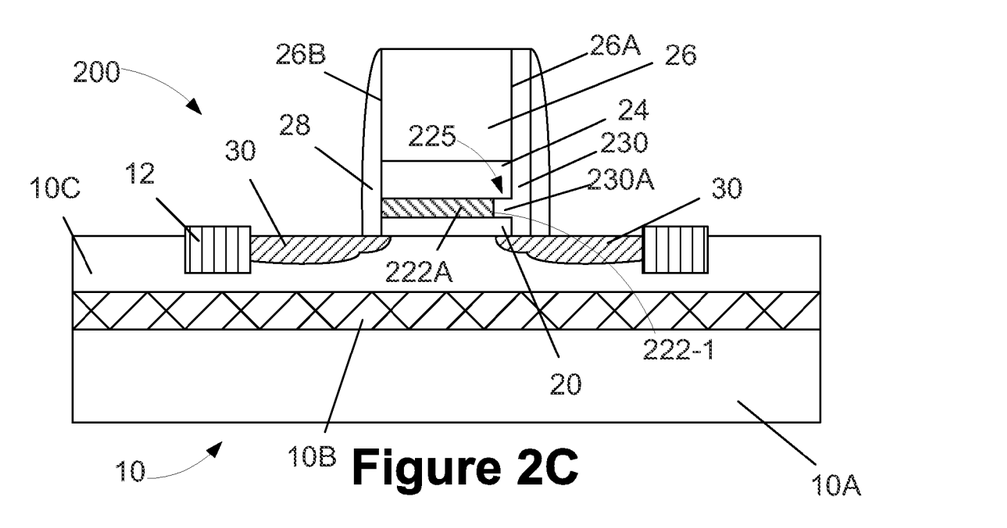

FIG. 2C depicts an illustrative embodiment of the device 200 wherein the charge storage layer 222 is asymmetrically in nature in that there is only one region 225 on the device 200. That is, in the illustrative example depicted in FIG. 2B, the first edge 222-1 of the is laterally and inwardly offset from the sidewall 26A of the gate electrode 26 while the second edge 222-2 of the charge storage layer 222 is substantially aligned with the sidewall 26B of the gate electrode 26. In the illustrative example depicted in FIG. 2C, an insulating material is also positioned or formed in the region 225.

Figure 3:
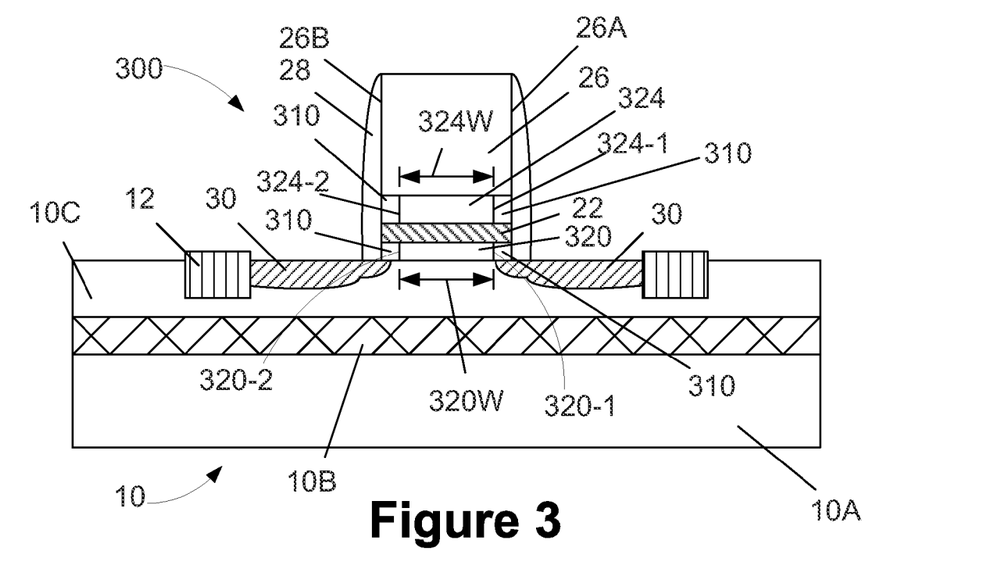
FIG. 3 depicts another illustrative example of a novel memory device described herein.

FIG. 3 depicts one illustrative example of another novel memory device disclosed herein. In general, the memory device 300 includes a gate insulation layer 320, a charge storage layer 22, a blocking insulation layer 324, a gate electrode 26, spacers 28, a plurality of air pockets or spaces 310 and illustrative source/drain regions 30. As with the memory device 200, the illustrative memory device 300 is formed in and above the active layer 10C of the semiconducting substrate 10.

In the device 300, the gate insulation layer 320 (which is sometimes referred to in the industry as a "tunnel oxide") may be comprised of a variety of materials, such as silicon dioxide, a combination of materials such as silicon dioxide/silicon nitride/silicon dioxide, etc., and it may have a thickness ranging from 5-10 nm. The charge storage layer 22, may be comprised of a variety of materials, such as silicon nitride, a conductive material, polysilicon, amorphous silicon, a high-k dielectric (k value greater than 10), etc., and it may have a thickness ranging from 5-10 nm. The blocking insulation layer 224, may be comprised of a variety of materials, such as silicon dioxide, a high-k insulating material such as those previously described, etc., and it may have a thickness ranging from 5-15 nm. The gate electrode 28, may be comprised of a variety of materials of conductive materials, such as polysilicon, amorphous silicon, silicon-germanium, germanium, etc., and it may have a thickness ranging from 80-150 nm.

In the device 300 can be seen therein, the gate insulation layer 320 and the blocking insulation layer 324 each have a width 320W and 324W, respectively, that is less than the gate length of the device 300, which is not depicted in FIG. 3 for clarity purposes but it would be the same as the gate length 200L depicted in FIG. 2B. In one illustrative embodiment, the widths 320W and 324W may be approximately 70-90% of the width of the gate electrode 26. The gate insulation layer 320 has a first edge 320-1 and a second edge 320-2. The blocking insulation layer 324 has a first edge 324-1 and a second edge 324-2. As noted previously, the gate electrode 26 has a first sidewall 26A and a second sidewall 26B. In the illustrative example depicted in FIG. 3, the first edge 320-1 of the gate insulation layer 320 and the first edge 324-1 of the blocking insulation layer 324 are each laterally and inwardly offset from the sidewall 26A of the gate electrode 26. In a similar fashion, the second edge 320-2 of the gate insulation layer 320 and the second edge 324-1 of the blocking insulation layer 324 are each laterally and inwardly offset from the sidewall 26B of the gate electrode 26. In the particular example depicted in FIG. 3, the lateral offsets for the gate insulation layer 320 and the blocking insulation layer 324 are approximately the same such that the gate insulation layer 320 and the blocking insulation layer 324 are both approximately symmetrically positioned above the channel region of the device 300. The lateral offsets for the gate insulation layer 320 and the blocking insulation layer 324 partially defines gaps 310 between the edges of the gate insulation layer 320 and the blocking insulation layer 324 and the sidewall spacer 28. In effect, these gaps 310 are regions that would normally be occupied by portions of the lateral offsets for the gate insulation layer 320 and the blocking insulation layer 324 in prior art memory device. In one illustrative example, these gaps 310 have the a width that is similar to the width 225W of the regions 225 discussed above, e.g., approximately equal to 5-15% of the gate length of the memory device 300. As noted, in the illustrative example depicted in FIGS. 3, the gaps 310 are substantially empty and the gap is occupied by air. Similar to the device 200, as will be appreciated by one skilled in the art, the various structures of the device 300 on an actual manufactured device, such as the gaps 310, the gate insulation layer 320, the blocking insulation layer 324, the edges 320-1, 320-2, 324-1, 324-2, etc. may not have the precise squared-edge configurations as depicted in the drawings. To the extent such a structure does not have a precise configuration, e.g., the gaps 310 may have a generally, somewhat tapered configuration, any reference to any such structure's length or width should be the greatest length or width of such a structure.

Figure 4A:
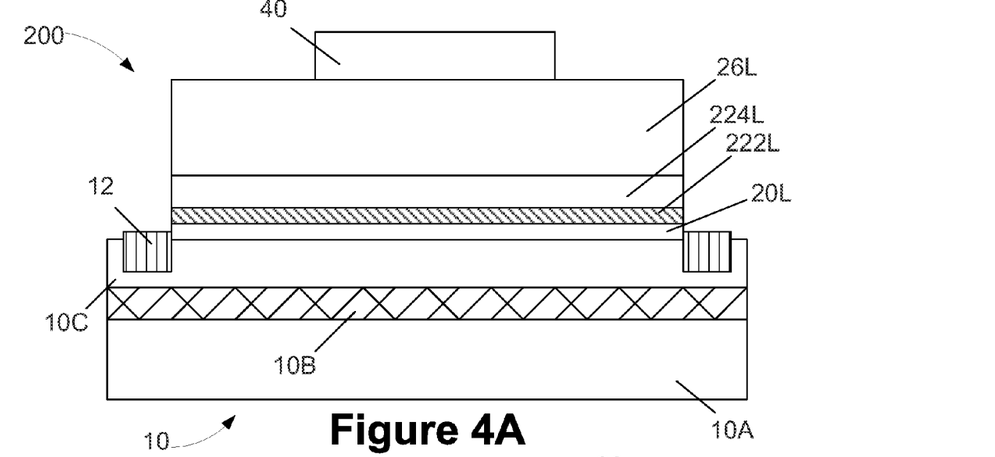
FIGS. 4A-4E depict one illustrative method of forming illustrative examples of a memory device described herein.

FIGS. 4A-4E depict one illustrative process flow that may be employed in manufacturing the illustrative memory device 200 depicted in FIGS. 2A-2B. For clarity purposes, only the formation of the gate structure of the device 200 will be depicted in FIGS. 4A-4E. As shown in FIG. 4A, an illustrative stack of materials comprising a gate insulation material layer 20L, a charge storage material layer 222L, a blocking insulation material layer 224L and a gate electrode material layer 26L are formed above the substrate 10. Of course, the depicted layer stack is illustrative in nature as there may be additional layers in the stack depending upon the particular application, or some of the depicted layers may have multiple layers, e.g., the gate electrode material layer 26L may comprise two separate conductive layers. The various material layers are formed to the desired thickness for each layer using traditional manufacturing techniques such as oxidation, chemical vapor deposition, physical vapor deposition, etc. An illustrative mask 40, e.g., photoresist, is formed above the layer stack.

Figure 4B:
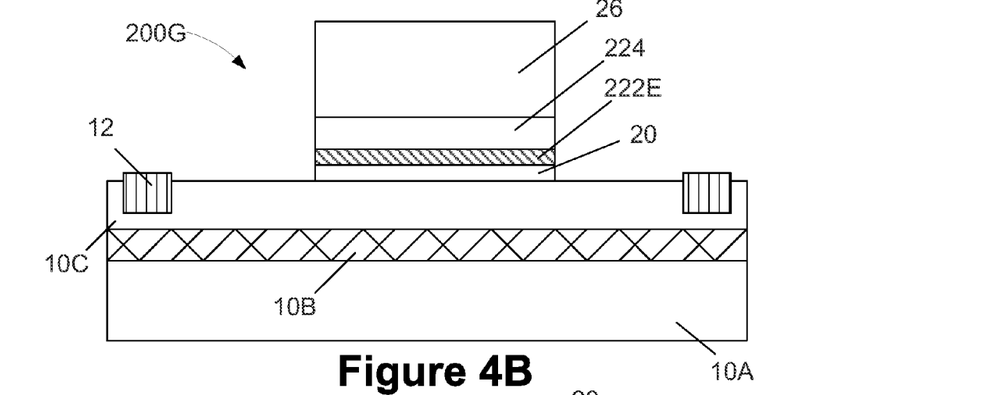

Next, as shown in FIG. 4B, multiple etching process are performed to pattern the material layers 20L, 222L, 224L and 26L to define the basic gate stack 200G. The etching chemistry employed may and likely be different for the various layers depending on the material of each of the layers. In one illustrative embodiment, the material layers are subjected to anisotropic etching processes to define the gate stack 200G, although other etching techniques may be employed. After the etching is complete, the mask 40 is removed. At this point, the gate stack 200G includes the gate insulation material layer 20, the initially formed charge storage layer 222E that was formed as a result of the gate stack etching, the blocking insulation layer 224 and the gate electrode 26.

Figure 4C:
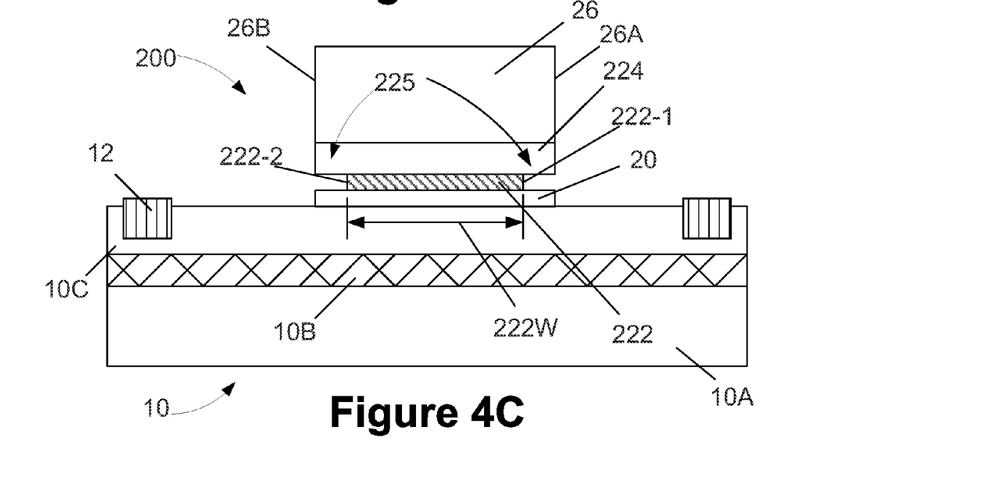
Figure 4D:
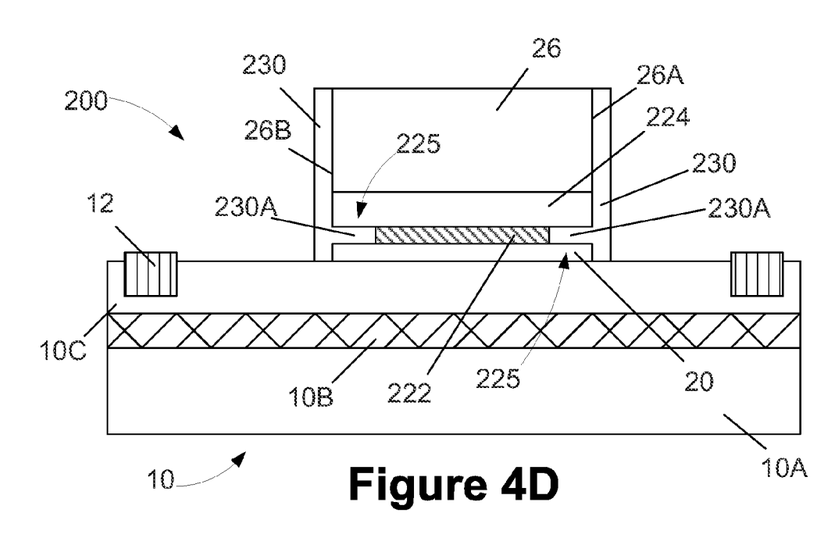
Figure 4E:
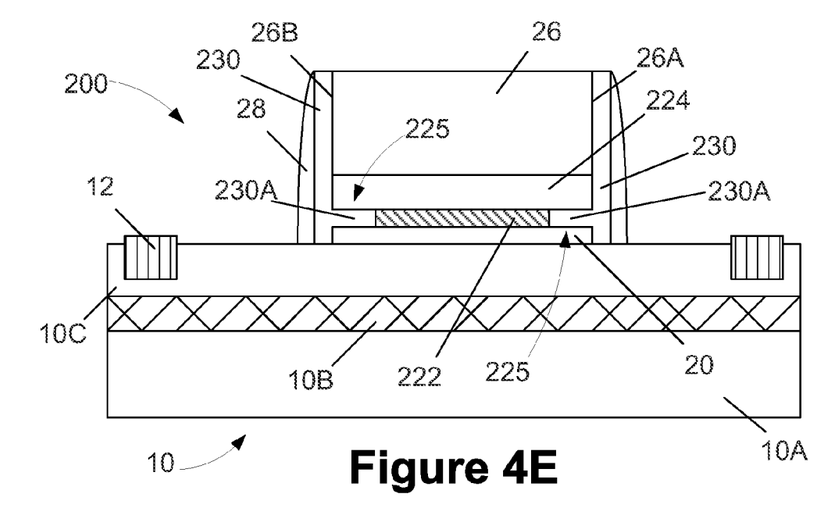

Next, as shown in FIG. 4C, in one illustrative embodiment, an isotropic etching process (wet or dry) that selectively attacks the material of the initially formed charge storage layer 222E for a time sufficient to produce the final charge storage layer 222 that has a width that is less that the width of the initial charge storage layer 222E. Next, as shown in FIG. 4D, in one illustrative embodiment, an oxidation process is performed to grow the layer of insulating material 230 comprised of silicon dioxide to the final desired thickness. Note that during this oxidation process, a portion 230A of the layer of insulating material 230 grows from the exposed edges 222-1, 222-2 of the final charge storage layer 222 and substantially fills the regions 225. This oxidation of the final charge storage layer 222 should be taken into account when determining the final desired width 222W of the charge storage layer 222. During this oxidation process, the layer of insulating material 230 also forms on the sidewalls of the other layers of the basic gate stack. To the extent that the surface of the active layer 10C is exposed and a layer of oxide (not shown) forms thereon, it may be removed in later cleaning processes. To the extent that any of the various material layers are not made of an oxidizing material, then the insulating material layer 230 may not fully or even partially cover such layers. In the illustrative example where the charge storage layer 222 is made of a high-k dielectric material, additional growth of the gate insulation layer 20 and the blocking insulation layer 224 may act to substantially fill the region 225. In some cases, the deposition process may be performed in an attempt to fill the region 225. Thereafter, as shown in FIG. 4E, sidewall spacers 28 are formed using traditional techniques, e.g., layer deposition followed by anisotropic etching. Additionally processing operations may then be performed to complete the formation of the device, e.g., additional implant processes (if needed), forming metallization layers, etc.

Figure 5A:
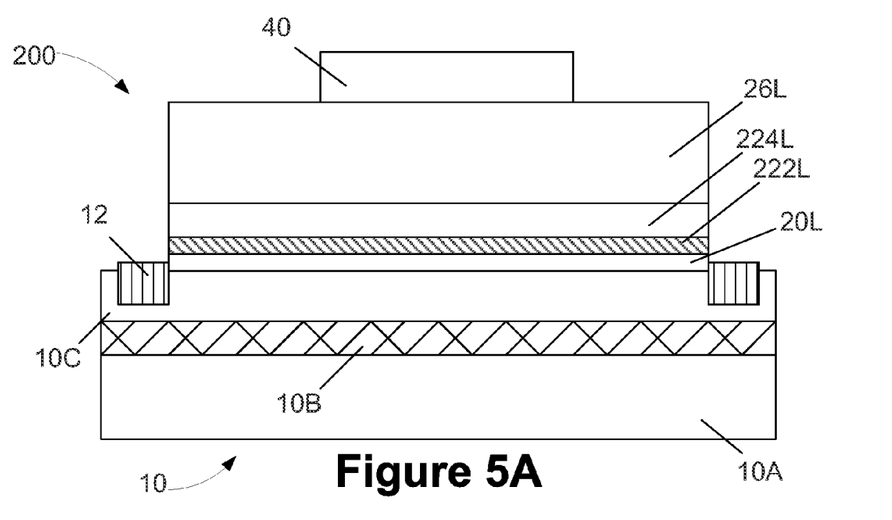
FIGS. 5A-5D depict another illustrative method of forming illustrative examples of a memory device described herein.
Figure 5B:
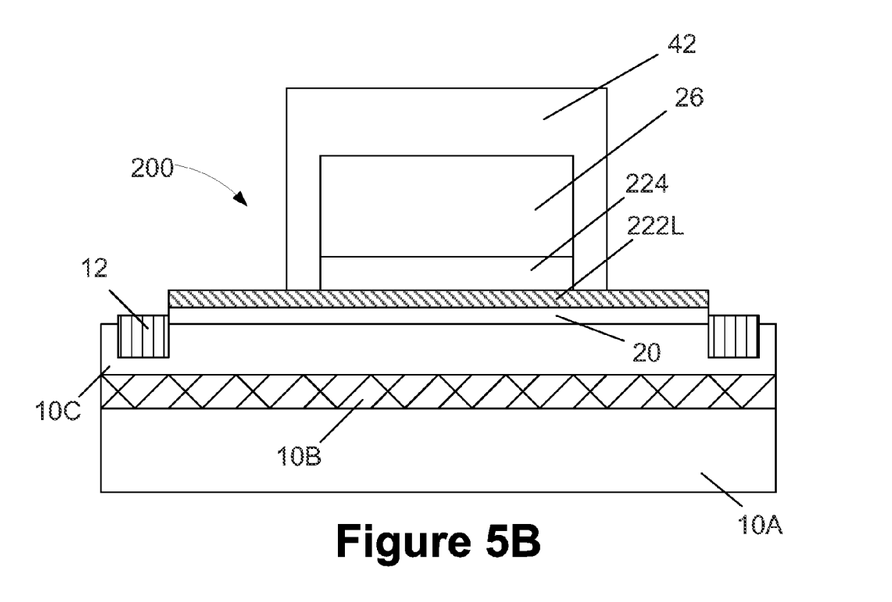
Figure 5C:
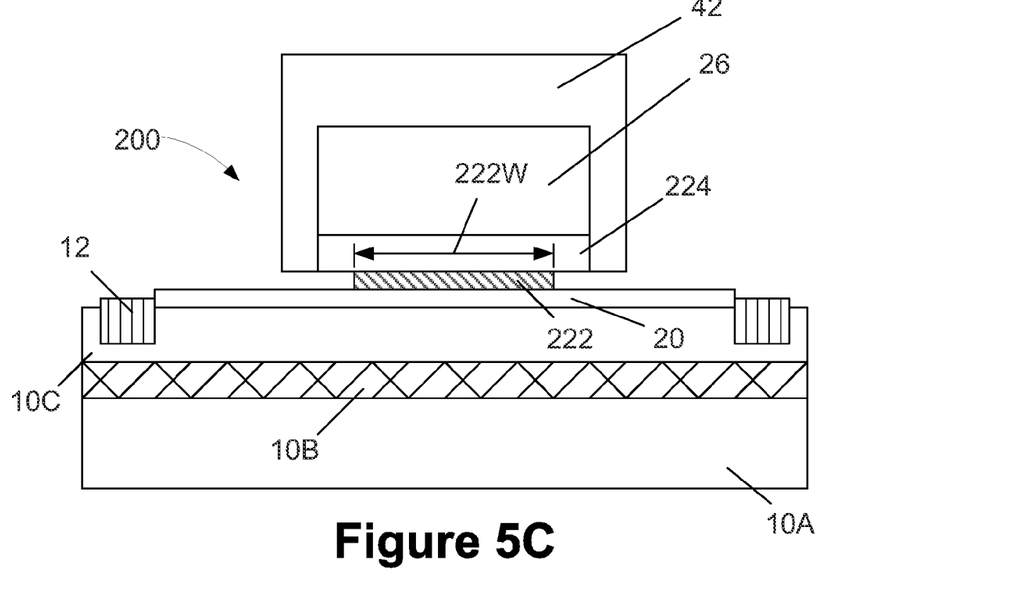
Figure 5D:
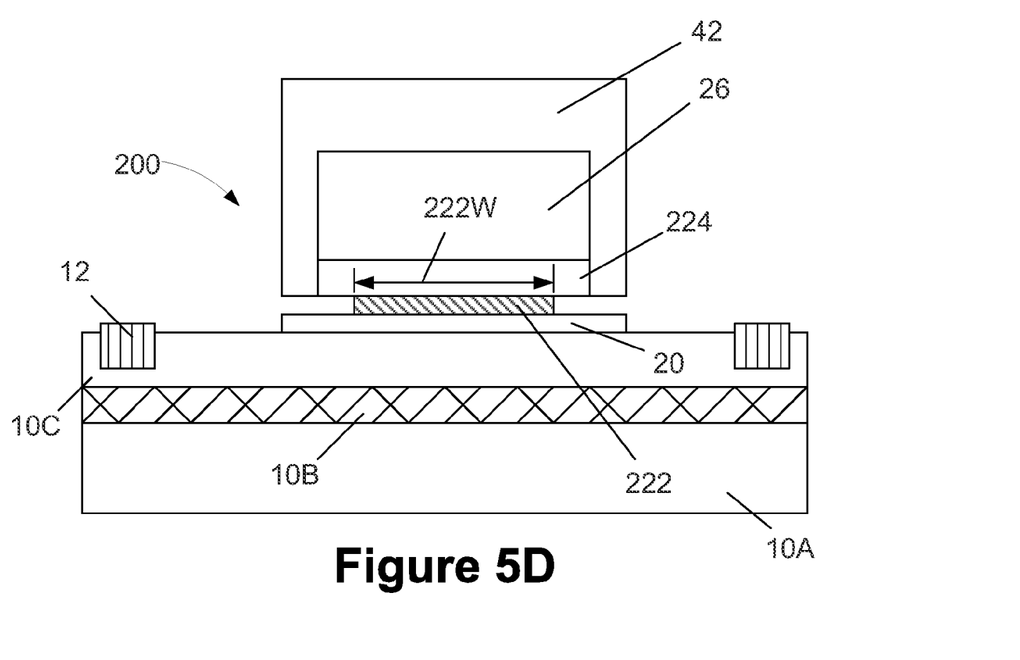

FIGS. 5A-5D depict portions of an illustrative process flow that may be performed to form a device 200 with a symmetrically positioned charge storage 222, as depicted in FIG. 3A in the illustrative example where the gate electrode 26 and the charge storage layer 222 are made of the same material, such as polysilicon, or of different materials that have similar etch characteristics, e.g., a polysilicon gate electrode and an amorphous silicon charge storage layer 222. As shown in FIG. 5A, the illustrative stack of materials comprising the gate insulation material layer 20L, the charge storage material layer 222L, the blocking insulation material layer 224L and the gate electrode material layer 26L are formed above the substrate 10 and the mask layer 40 is formed there above. Next, as shown in FIG. 5B, multiple etching process are performed to pattern the material layers 224L and 26L to define the gate electrode 26 and the blocking insulation layer 224 of the device 200. Then, a second mask layer 42, e.g., photoresist, is formed above the device 200 to cover the gate electrode 26 and the blocking insulation layer 224. Next, as shown in FIG. 5C, in one illustrative embodiment, an isotropic etching process (wet or dry) that selectively attacks the material of the charge storage material layer 222L for a time sufficient to produce the final charge storage layer 222 that has a width less than the width of the gate electrode 26. Then, with the mask layer 42 in place, an etching process is performed to etch the gate insulation material layer 20L to thereby result in the gate insulation layer 20 of the desired width. Next, the mask layer 42 is removed and processing continues with the formation of the layer of insulating material 230 as described above. Thereafter, additional processing is performed to complete the formation of the device 200.

Figure 6A:
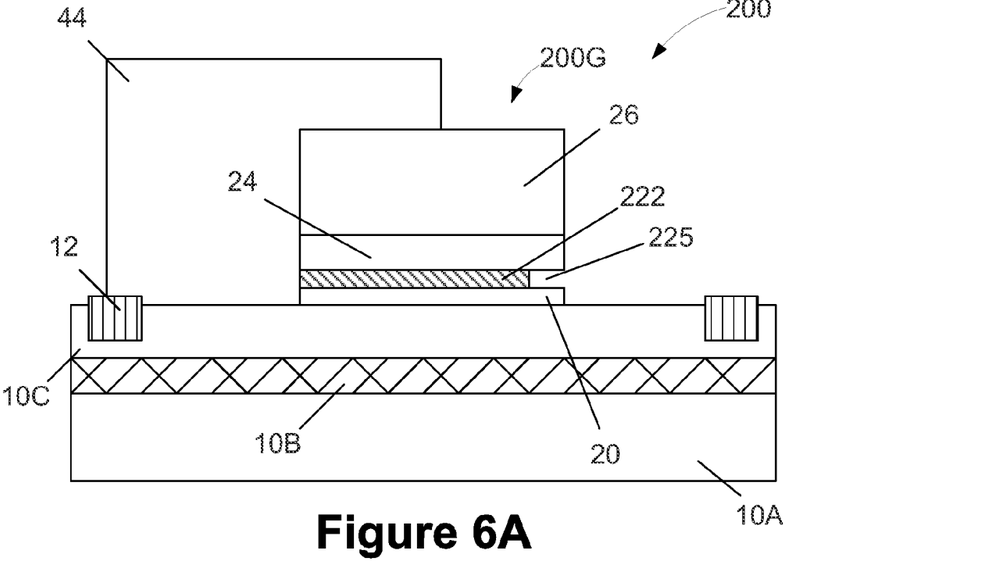
FIGS. 6A-6C depict yet another illustrative method of forming illustrative examples of a memory device described herein.
Figure 6B:
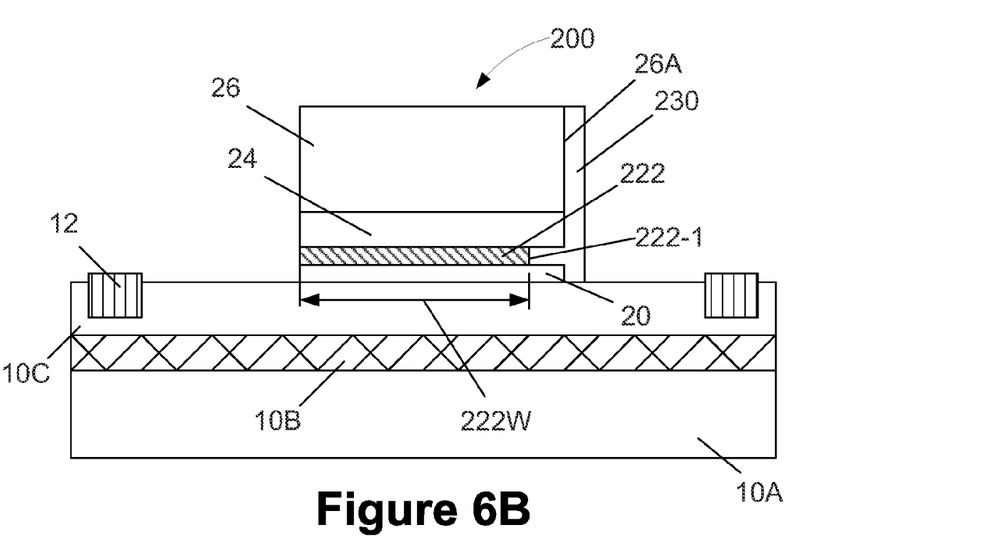
Figure 6C:
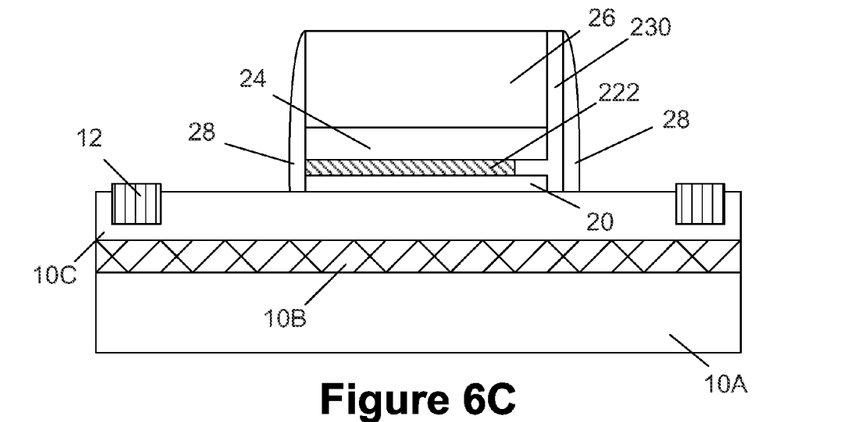

FIGS. 6A-6C, depict one illustrative example of a process flow that may be employed to form an asymmetrically positioned charge storage layer 222 as depicted in FIG. 2C. FIG. 6A depicts the device at a point where the basic gate stack 200G has been formed, as described in connection with FIG. 4B above, and a mask layer 44 is formed above the device so as to mask one side of the gate stack 200G and expose one side of the gate stack 200G to further processing. Next, as shown in FIG. 6A, in one illustrative embodiment, an isotropic etching process (wet or dry) that selectively attacks the exposed portion of material of the initially formed charge storage layer 222E is performed for a time sufficient to produce the charge storage layer 222 with a width that is less than the width of the initially formed charge storage layer 222E and less that the width of the gate electrode 26. This etching acts to create a single region 225 for the device 200. Then, as shown in FIG. 6B, in one illustrative embodiment, an oxidation process is performed to grow the layer of insulating material 230 comprised of silicon dioxide to the final desired thickness as previously described. Thereafter, as shown in FIG. 6C, the masking layer 44 is removed and the further processing is performed to complete the device 200.

Figure 7A:
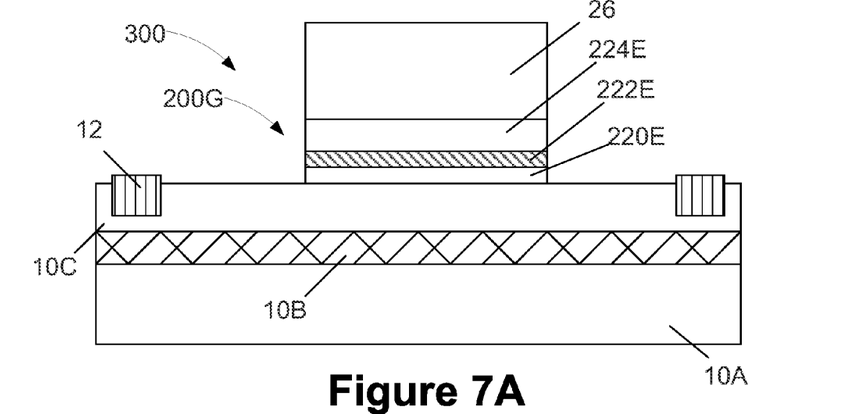
Figure 7B:
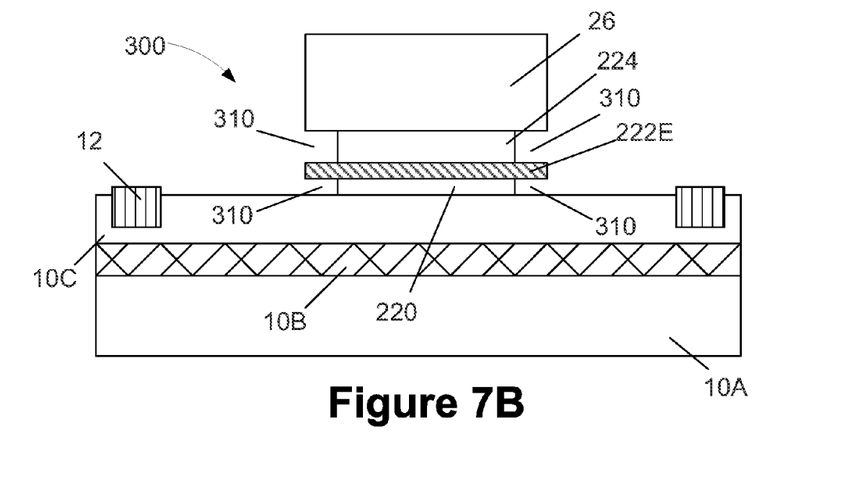
Figure 7C:
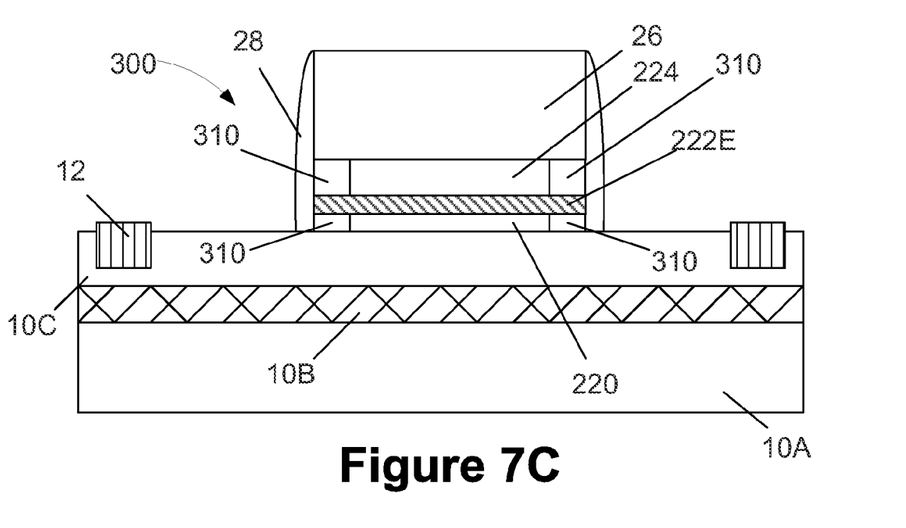

FIGS. 7A-7C, depict one illustrative example of a process flow that may be employed to form the illustrative memory device 300 depicted in FIG. 3. FIG. 7A depicts the device at a point where the basic gate stack 200G has been formed, as described in connection with FIG. 4B above. Next, as shown in FIG. 7B, in one illustrative embodiment, an isotropic etching process (wet or dry) is performed that selectively attacks the exposed portion of materials of the initially formed gate insulation layer 220 and the initially formed blocking insulation layer 224E. This processing results in the partially formation of the gaps 310 positioned proximate the opposite ends of the final gate insulation layer 222 and the final blocking insulation layer 224. The final gate insulation layer 222 and the final blocking insulation layer 224 have a width that is less than the width of initial gate insulation layer 222 and the initial blocking insulation layer 224 that were defined when the gate stack 200 was first formed. Then, as shown in FIG. 7B, some sort of structure or material layer, for example sidewall spacers 28, are formed to effectively seal off and define the gaps 310. Of course, the gaps 310 could by formed by forming any material or structure, not just sidewall spacers proximate at least the full width gate electrode 26 and the full width charge storage layer 22.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a patterned gate stack for a memory device, said patterned gate stack comprising a gate insulation layer, a charge storage layer, a blocking insulation layer and a gate electrode, said gate insulation layer and said blocking insulation layer having an initial width;
   performing an etching process on said patterned gate stack to selectively remove at least a portion of each of said gate insulation layer and said blocking insulation layer, said etching process reducing a width of each of said gate insulation layer and said blocking insulation layer from said initial width to a final width; and
   after performing said etching process, forming at least one material layer proximate sidewalls of said patterned gate stack, said at least one material layer laterally confining each of said gate insulation layer, said charge storage layer, said blocking insulation layer, and said gate electrode.

2. The method of claim 1, wherein said at least one material layer formed proximate said sidewalls of said patterned gate stack defines gaps proximate opposite ends of each of said gate insulation layer and said blocking insulation layer.

3. The method of claim 2, wherein each of said gaps is substantially free of solid material.

4. The method of claim 1, wherein said final width is approximately 70-90% of said initial width.

5. The method of claim 1, wherein forming at least one material layer proximate said sidewalls of said patterned gate stack comprises forming a sidewall spacer element.

6. The method of claim 1, wherein said gate insulation layer and said blocking insulation layer comprise a first material and said charge storage layer comprises a second material that is different than said first material.

7. The method of claim 6, wherein said first material is one of silicon dioxide and silicon nitride and said second material is one of silicon nitride and polysilicon.

8. A method, comprising:
forming a gate stack of a memory device, said gate stack comprising a gate insulation layer having first and second edges, a charge storage layer formed above said gate insulation layer and having first and second edges, a blocking insulation layer formed above said charge storage layer and having first and second edges, and a gate electrode formed above said blocking insulation layer and having first and second sidewalls, wherein said first edge of said charge storage layer is laterally and inwardly offset from said first edge of said gate insulation layer, said first edge of said blocking insulation layer, and said first sidewall;
forming a first spacer adjacent to said first sidewall and said respective first edges of said gate insulation layer, said charge storage layer, and said blocking insulation layer, said gate insulation layer, said blocking insulation layer, and said first spacer at least partially defining a first gap that is positioned laterally adjacent to at least said first edge of said charge storage layer; and
forming a second spacer adjacent to said second sidewall and said respective second edges of said gate insulation layer, said charge storage layer, and said blocking insulation layer, said first and second spacers laterally confining each of said gate insulation layer, said charge storage layer, said blocking insulation layer, and said gate electrode.

9. The method of claim 8, wherein said gate stack is formed so that said respective first edges of said gate insulation layer and said blocking insulation layer are substantially aligned with said first sidewall.

10. The method of claim 9, further comprising, prior to forming said first spacer, forming a layer of insulating material on said substantially aligned first edges and first sidewall, said layer of insulating material substantially filling said first gap.

11. The method of claim 9, wherein said first spacer is formed on and in contact with said substantially aligned first edges and first sidewall, and wherein after forming said first spacer said first gap is substantially free of solid material.

12. The method of claim 9, wherein said gate stack is formed so that said respective second edges of said gate insulation layer, said charge storage layer, and said blocking insulation layer are substantially aligned with said second sidewall and said second spacer is formed on and in contact with said substantially aligned second edges and second sidewall.

13. The method of claim 9, wherein said gate stack is formed so that said second edge of said charge storage layer is laterally and inwardly offset from said second edge of said gate insulation layer, said second edge of said blocking insulation layer, and said second sidewall, and wherein said gate insulation layer, said blocking insulation layer, and said second spacer at least partially define a second gap that is positioned laterally adjacent to at least said second edge of said charge storage layer.

14. The method of claim 13, wherein said first and second gaps are substantially free of solid material.

15. The method of claim 13, further comprising:
prior to forming said first spacer, forming a first layer of insulating material on said substantially aligned first edges and first sidewall, said first layer of insulating material substantially filling said first gap; and
prior to forming said second spacer, forming a second layer of insulating material on said substantially aligned second edges and second sidewall, said second layer of insulating material substantially filling said second gap.

16. A method for forming a memory device, the method comprising:
forming a gate insulation layer having a first width above a semiconducting substrate;
forming a charge storage layer having a second width above said gate insulation layer, said second width being less than said first width;
forming a blocking insulation layer having said first width above said charge storage layer;
forming a gate electrode having said first width above said blocking insulation layer; and
forming a sidewall spacer adjacent to and laterally confining each of said gate insulation layer, said charge storage layer, said blocking insulation layer, and said gate electrode, wherein said sidewall spacer, said gate insulation layer, and said blocking insulation layer at least partially define a first gap that is positioned laterally adjacent to at least a first edge of said charge storage layer.

17. The method of claim 16, wherein said sidewall spacer, said gate insulation layer, and said blocking insulation layer at least partially define a second gap that is positioned laterally adjacent to at least a second edge of said charge storage layer.

18. The method of claim 16, wherein said first width is approximately 70-90% of said second width.

19. The method of claim 16, wherein said charge storage layer comprises silicon nitride and said gate electrode comprises polysilicon.

20. The method of claim 16, wherein said charge storage layer and said gate electrode comprise a same material.

* * * * *